United States Patent [19]

Soma et al.

[11] Patent Number: 4,973,799
[45] Date of Patent: Nov. 27, 1990

[54] PRINTED CIRCUIT BOARD FOR USE WITH AN IMAGE FORMING APPARATUS

[75] Inventors: Utami Soma; Yasufumi Koseki, both of Hino; Minoru Asakawa, Hachioji, all of Japan

[73] Assignee: Konica Corporation, Tokyo, Japan

[21] Appl. No.: 396,342

[22] Filed: Aug. 21, 1989

[30] Foreign Application Priority Data

Sep. 2, 1988 [JP] Japan .................................. 63-220756

[51] Int. Cl.⁵ .............................................. H05K 1/00
[52] U.S. Cl. ...................................... 174/260; 174/36; 361/414
[58] Field of Search ............... 174/250, 255, 256, 262, 174/260, 36; 361/414

[56] References Cited

U.S. PATENT DOCUMENTS

| | | | |
|---|---|---|---|
| 3,417,294 | 12/1968 | Steidlitz | 174/260 X |
| 3,680,005 | 7/1972 | Jorgensen et al. | 361/414 X |
| 4,498,122 | 2/1985 | Rainal | 174/36 X |
| 4,554,405 | 11/1985 | Varker | 361/414 X |
| 4,675,788 | 6/1987 | Breitling et al. | 174/36 X |
| 4,743,710 | 5/1988 | Shieber et al. | 174/36 |
| 4,754,371 | 6/1988 | Nitta et al. | 174/36 X |
| 4,801,489 | 1/1989 | Nakagawa et al. | 174/36 X |
| 4,816,616 | 3/1989 | Jones | 174/36 X |

FOREIGN PATENT DOCUMENTS 2039153 7/1980 United Kingdom ................ 361/414

Primary Examiner—Morris H. Nimmo
Attorney, Agent, or Firm—Finnegan, Henderson, Farabow, Garrett and Dunner

[57] ABSTRACT

A circuit board for mounting a CPU for controlling an image processing apparatus, comprising a multilayered circuit board for mounting the CPU, and a shield layer for shielding the multilayered circuit board without connecting the shield layer to the circuits of the board. The circuits of the multilayered circuit board are produced by a printing or an electrolytic plating method or an electroless plating method.

16 Claims, 2 Drawing Sheets

PRINTED CIRCUIT BOARD FOR USE WITH AN IMAGE FORMING APPARATUS

BACKGROUND OF THE INVENTION

1. Field of the Invention

The present invention relates to a multi-layer printed circuit board provided with a means for absorbing noise in an image forming apparatus.

2. Description of the Related Art

The performance of image forming apparatus, such as copiers or the like have recently been enhanced and they have been made more compact, resulting in more complicated electronic circuits used in the apparatus. Therefore, the apparatus employs a printed circuit board which is compactly composed and is multi-layered.

In image forming apparatus, however, there are noise-generating sources such as plural high voltage power units, motors, plungers, relays and others are locate therein. Therefore, when a CPU (Central Processing Unit) controls a sequence of image forming, the control is disturbed by the noise of the noise-generating sources, resulting in possible problems. In particular, the influence of noise is more serious on printed circuit boards in a photoreceptor drum which tends to be located in the vicinity of a high voltage noise source. Therefore, noise-preventing items such as capacitors, coils and EMI filters are connected to the electronic circuit related to the noise source.

As stated above, the effect of noise prevention by means such as capacitors, filters and others depends practically on the configuration of a printed circuit board and on the kinds of parts to be used. Accordingly, many parts are connected on a trial and error basis on each occasion, resulting in a cost increase.

Further, a multi-layer printed circuit board makes it difficult to incorporate additional parts later, and the printed circuits mutual interference is not only two dimensional but three dimensional, resulting generally in a drastic fall in the level of noise resistance. For example, in the case of a normal printed circuit board having circuits on both sides, the distance between both circuits is about 1.6 mm, while on a multi-layer printed circuit board, the distance is about 50 µm which is less than one hundredth of the normal circuit distance. Therefore, it has been confirmed that anti-noise property falls drastically from 5 locations on a double-sided printed circuit board down to "locations on a multi-layer printed circuit board, when they are compared in terms of the number of location points where an error is caused by a given prescribed noise signal at 150 locations. Further, in a comparison of discharge noise resistance, measurements of arcing in the vicinity of a printed circuit board have proved that a double-sided printed circuit board can withstand up to as much as 4 KV, while a multi-layered printed circuit board can withstand up to 2 KV at the most. Thus, a conventional multi-layered printed circuit board has many problems.

SUMMARY OF THE INVENTION

An object of the invention is to provide a printed circuit board for an image forming apparatus wherein existing problems have been solved by providing a shield layer on a multi-layered board to avoid errors in an image forming apparatus wherein a CPU is used for controlling the sequence of image forming, the errors being caused by noise from high voltage power units, motors, solenoids and others.

Additional objects and advantages of the invention will be set forth in part in the description which follows, and in part will be obvious from the description, or may be learned by practice of the invention. The objects and advantages of the invention will be realized and obtained by means of the elements and combinations particularly pointed out in the appended claims.

The aforesaid object of the invention is attained by a printed circuit board for an image forming apparatus wherein a board, having a CPU mounted thereon and is incorporated in a photoreceptor drum unit, is multi-layered, the circuit layers are formed by a printing method, and a layer which is not connected to any points of a circuit is formed entirely on aforesaid board.

BRIEF DESCRIPTION OF THE DRAWINGS

The accompanying drawings, which are incorporated in and constitute a part of this specification, illustrate presently preferred embodiments of the invention and together with the general description given above and the detailed description of the preferred embodiments given below, serve to explain the principles of the invention.

DETAILED DESCRIPTION OF THE PREFERRED EMBODIMENT

The invention will be explained as follows with an example of a printed circuit board used in an ordinary copying machine.

Figure 1:
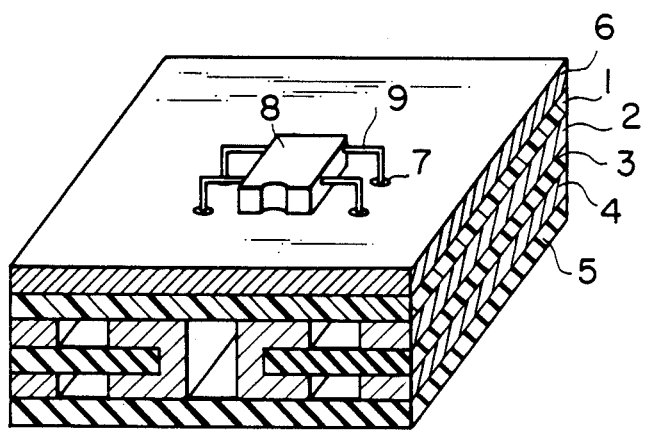
FIG. 1 is a perspective view showing the structure of a multi-layered printed circuit board which is an embodiment of the present invention.
Figure 2:
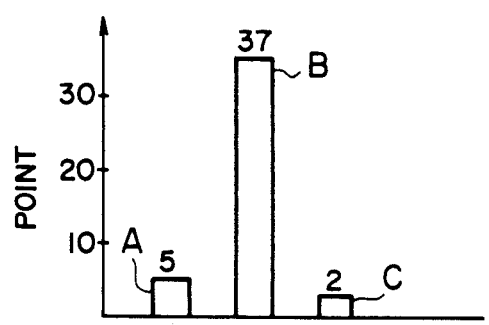
FIG. 2 is a graph sowing anti-noise properties of printed circuit boards and FIGS. 3, 4 and 5 represent sectional views showing embodiments of the present invention.

In the example of FIG. 1, base material 1 is a paper phenol of about 1.6 mm in thickness or formed of glass, epoxy or the like, and thereon, the, first circuit layer Z is formed to be about 35 µm through a printing process or an electrolytic plating method. On the surface of the first circuit layer, namely on the surface that is opposite to the contact face between base material 1 and first circuit layer 2, epoxy type insulating materials are coated through a plurality of processes to form the first insulation layer 3. This insulation layer 3 is about 50 µm in thickness and has a dielectric strength of a printing process of about 1000 V. Further, the second circuit layer 4 is provided, by means of an electroless plating method, on the surface of the first insulation layer 3, namely on the surface that is opposite to the contact face between first insulation layer 3 and first circuit layer 2. In addition to that, the second insulation layer (insulating protective layer) 5 is formed on the surface of second circuit layer 4, namely on the surface opposite to the contact face between first insulation layer 3 and second circuit layer 4, for the purpose of protecting the circuits. The multi-layered printed circuit boards mentioned above are generally conventional in structure. In the invention, shield 6 is provided on the entire surface of base material 1 of aforesaid multi-layered printed circuit board, namely on the surface opposite to the contact face between base material 1 and the first circuit layer. Shield 6 is formed to incorporate isolated holes 7, so that CPU 8 can be connected by connector terminals 9. The shield 6, through a ground is basically an electromagnetic and electrostatic shield. Therefore, noises of various types generated in an image forming apparatus are absorbed by this shield 6, resulting in a great improvement in anti-noise properties. An example of anti-noise properties is shown in FIG. 2, wherein there is indicated the number of erroneous actions obtained, in a method wherein signals of DC 260 V and 50 ns width are connected through the coupling connection and a prescribed noise is inputted at 150 locations that represent all input and output ports of the sequence control board of an image forming apparatus in which the sequences are controlled by a CPU. For the purpose of comparison, the results of measurements for three types of printed circuit boards are shown in FIG. 2. A shows the number of points for erroneous actions for a double-sided printed circuit board of a conventional type, B shows those for a multi-layered printed circuit board of a conventional type and C shows that for a multi-layered printed circuit board of the invention. The figure shown on the top of each bar of the bar graph is the number of points of erroneous actions, and the smaller the figure is, the higher the anti-noise property is. From this, it is clear that the multi-layered printed circuit board of the invention is superior to conventional ones in anti-noise properties.

The aforesaid description is for a 2-layer printed circuit board. The invention can also be applied in the same way to printed circuit boards having a plurality of layers. It is possible to take actions which are more effective for reducing the influence of noise by providing, on each interface, a shield suitable for the circuit as a boundary layer.

Figure 3:
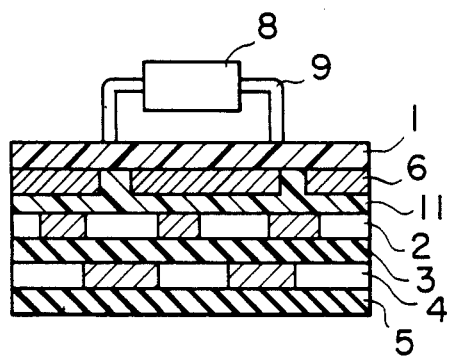
Figure 4:
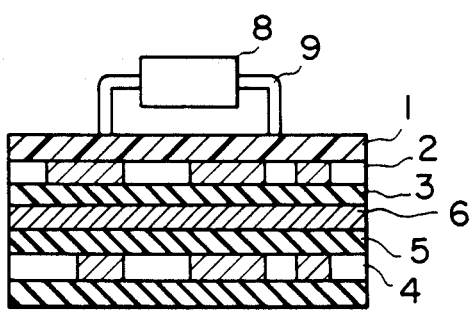
Figure 5:
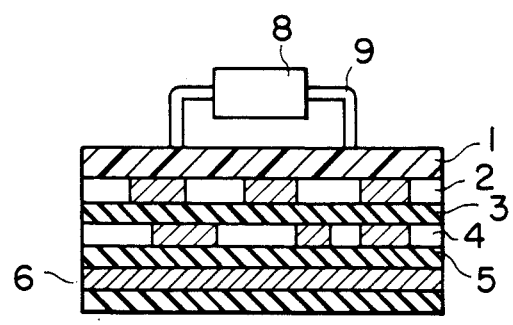

FIG. 3 shows an example wherein shield 6 is provided between base material 1 and the second base material 11, while FIG. 4 shows an example wherein shield 6 is provided between the first insulation layer 3 and the second insulation layer 5. FIG. 5 shows an example wherein shield 6 is provided on the outer surface of the second insulation layer 5, namely on the surface opposite to the contact face between the second insulation layer 5 and the second circuit layer 4. When the invention is applied to a printed circuit board having no CPU thereon, and incorporated in a photoreceptor unit that is subject to the influence of high voltage noise in an image forming apparatus, the noise is absorbed directly by the printed circuit board.

As stated above, in an image forming apparatus wherein its sequence is controlled by a CPU, high voltage power supplies motors, plungers and others have caused the CPU to generate erroneous actions, resulting in an occurrence of serious problems happening as a chain reaction. Owing to the present invention, however, it has become possible, by providing shields on a multi-layered printed circuit board, to eliminate the aforesaid problems and thereby to provide a multi-layered printed circuit board for an image forming apparatus which drives electronic circuits normally and safely.

Other embodiments of the invention will be apparent to those skilled in the art from consideration of the specification and practice of the invention disclosed herein. It is intended that the specification and examples be considered as exemplary only. Therefore, the invention in its broader aspects is not limited to the specific details, representative devices, and illustrative examples shown and described. Accordingly, departures may be made from such details without departing from the spirit or scope of the general inventive concept as defined by the appended claims and their equivalents.

What is claimed is:

1. An arrangement for mounting a CPU for controlling an image processing apparatus, the arrangement comprising:
    a base, the base having a first side including a first surface, and a second side which is opposite to the first side, a CPU being mounted on the base and being located on the first side of the base in proximity to the first surface;
    a plurality of circuit layers located on the second side of the base;
    at least one insulating layer located between each of the circuit layers; and
    means comprising a shield layer for shielding the CPU from at least one of the electromagnetic noise and electrostatic noise.

2. The arrangement of claim 1, wherein the shielding means is unconnected to the circuit layers.

3. The arrangement of claim 1, wherein the shielding means is grounded.

4. The arrangement of claim 1, wherein the base and the shield layer are substantially parallel planar surfaces.

5. The arrangement of claim 1, wherein the shield layer is on the first surface of the base.

6. The arrangement of claim 1, wherein the shield layer is between the base and the plurality of circuit layers, and a second base is between the shield layer and the plurality of circuit layers.

7. The arrangement of claim 1, wherein the shield layer is between two adjacent ones of the circuit layers.

8. The arrangement of claim 1, wherein the plurality of circuit layers is between the base and the shield layer.

9. A circuit board for mounting a component, the circuit board comprising:
    a base, the base having a first side including a first surface, and a second side which is opposite to the first side, a component being mounted on the base and being located on the first side of the base in proximity to the first surface;
    a plurality of circuit layers located on the second side of the base;
    at least one insulating layer located between each of the circuit layers; and
    means comprising a shield layer for shielding the component from at least one of electromagnetic noise and electrostatic noise.

10. The circuit board of claim 9, wherein the shielding means is unconnected to the circuit layers.

11. The circuit board of claim 9, wherein the shielding means is grounded.

12. The circuit board of claim 9, wherein the abase and the shield layer are substantially parallel planar surfaces.

13. The circuit board of claim 9, wherein the shield layer is on the first surface of the base.

14. The circuit board of claim 9, wherein the shield layer is between the base and the plurality of circuit layers, and a second base is between the shield layer and the plurality of circuit layers.

15. The circuit board of claim 9, wherein the shield layer is between two adjacent ones of the circuit layers.

16. The circuit board of claim 9, wherein the plurality of circuit layers is between the base and the shield layer.

* * * * *